United States Patent
He et al.

(10) Patent No.: US 10,255,858 B2
(45) Date of Patent: Apr. 9, 2019

(54) PIXEL COMPENSATION CIRCUIT AND AMOLED DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiaoxiang He, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 182 days.

(21) Appl. No.: 15/516,268

(22) PCT Filed: Jul. 28, 2016

(86) PCT No.: PCT/CN2016/092045
§ 371 (c)(1),
(2) Date: Mar. 31, 2017

(87) PCT Pub. No.: WO2017/117983
PCT Pub. Date: Jul. 13, 2017

(65) Prior Publication Data
US 2018/0233086 A1 Aug. 16, 2018

(30) Foreign Application Priority Data

Jan. 4, 2016 (CN) .......................... 2016 1 0006703

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *H01L 27/3276* (2013.01);
(Continued)

(58) Field of Classification Search
CPC ............... G09G 3/3258; G09G 3/3233; G09G 2310/0264; H01L 51/5221; H01L 27/3276; H01L 51/5206
See application file for complete search history.

(56) References Cited

U.S. PATENT DOCUMENTS

2006/0077194 A1 4/2006 Jeong
2006/0244695 A1 11/2006 Komiya
(Continued)

FOREIGN PATENT DOCUMENTS

CN      1874627 A     12/2006
CN    100461246 C      2/2009
(Continued)

OTHER PUBLICATIONS

International Search Report and Written Opinion dated Sep. 30, 2016; PCT/CN2016/092045.
(Continued)

*Primary Examiner* — Andrew Sasinowski
(74) *Attorney, Agent, or Firm* — Ladas & Parry LLP; Loren K. Thompson

(57) ABSTRACT

The present disclosure relates to a pixel compensation circuit and an AMOLED display device. The pixel compensation circuit includes a data signal writing sub-circuit, a high voltage signal writing sub-circuit, a first reference voltage writing sub-circuit, a second reference voltage writing sub-circuit, a voltage maintaining sub-circuit, a driving transistor, a capacitor, and a light emitting device. The data signal writing sub-circuit is connected to a first terminal of the capacitor, the first reference voltage writing sub-circuit
(Continued)

is connected to a control electrode of the driving transistor, and the second reference voltage writing sub-circuit is connected to a drain of the driving transistor. The high voltage signal writing sub-circuit is connected to a second terminal of the capacitor, and the voltage maintaining sub-circuit is connected to the first terminal of the capacitor and the control electrode of the driving transistor.

18 Claims, 6 Drawing Sheets

(51) Int. Cl.
*H01L 51/52* (2006.01)
*H01L 27/32* (2006.01)

(52) U.S. Cl.
CPC ...... *H01L 51/5206* (2013.01); *H01L 51/5221* (2013.01); *G09G 2310/0264* (2013.01)

(56) References Cited

U.S. PATENT DOCUMENTS

| | | | |
|---|---|---|---|
| 2014/0035799 A1 | 2/2014 | Bae et al. | |
| 2014/0098082 A1 | 4/2014 | Kwon et al. | |
| 2014/0333512 A1 | 11/2014 | In et al. | |
| 2015/0070339 A1* | 3/2015 | Ahn | G09G 3/3233 345/211 |
| 2015/0154906 A1* | 6/2015 | Chung | G09G 3/3233 345/212 |
| 2015/0356924 A1 | 12/2015 | Chen et al. | |
| 2016/0078816 A1* | 3/2016 | Bae | G09G 3/3266 345/215 |

FOREIGN PATENT DOCUMENTS

| | | |
|---|---|---|
| CN | 103578416 A | 2/2014 |
| CN | 103778889 A | 5/2014 |
| CN | 104050917 A | 9/2014 |
| CN | 104835452 A | 8/2015 |
| CN | 105427809 A | 3/2016 |

OTHER PUBLICATIONS

The First Chinese Office Action dated Jul. 28, 2017; Appln. No. 201610006703.4.

\* cited by examiner

PIXEL COMPENSATION CIRCUIT AND AMOLED DISPLAY DEVICE

TECHNICAL FIELD

The present disclosure relates to the field of displaying technique, and more particularly to a pixel compensation circuit and an AMOLED display device.

BACKGROUND

The Flat Panel Display (hereinafter referred to as FPD) has been widely applied, because of its numerous advantages such as thin body, power saving, no radiation etc. The FPD in the prior art mainly includes Liquid Crystal Display (hereinafter referred to as LCD) and Organic Light Emitting Diode (OLED) display.

The OLED display effectuates displaying through self-luminance, thus it requires no backlight source, and the OLED display has outstanding properties such as high contrast ratio, small thickness, wide viewing angle, fast reaction speed, capability of being made into a flexible display panel, wide temperature application range, simplicity in structure and manufacturing etc., it is thus considered as a next-generation display that can replace the LCD.

OLED may be divided into two categories of Passive Matrix OLED (PMOLED) and Active Matrix OLED (AMOLED), namely, two categories of direct addressing and thin film transistor (TFT) matrix addressing. PMOLED has higher power consumption, which hinders its application in large-sized display devices, so PMOLED is usually employed in small-sized display devices. AMOLED is usually employed in high-definition large-sized display devices because of its high light emitting efficiency.

FIG. 1 is a circuit diagram of the AMOLED pixel circuit in the prior art. Within a display region of an AMOLED display device, pixels are arranged in a matrix that includes a plurality of rows and a plurality of columns, and each pixel is usually driven by a pixel circuit composed by two thin film transistors and one capacitor, that is, it is driven by adopting the 2T1C manner. Specifically, a gate of a first transistor T1 is electrically connected to a gate line Scan, a source of the first transistor T1 is electrically connected to a data signal line DATA, and a drain of the first transistor T1 is electrically connected to a gate of the second transistor T2 and one terminal of the capacitor C. A source of the second transistor T2 is electrically connected to a high voltage signal terminal VDD, and a drain of the second transistor T2 is electrically connected to an anode of an organic light emitting diode D. A cathode of the organic light emitting diode D is electrically connected to a common ground electrode VSS. In addition, one terminal of the capacitor C is electrically connected to the drain of the first transistor T1, and the other terminal of the capacitor C is electrically connected to the source of the second transistor T2. When the pixel performs displaying, the gate line Scan controls to turn on the first transistor T1, and a data signal voltage of the data signal line DATA enters the gate of the second transistor T2 and the capacitor C through the first transistor T1; thereafter, the first transistor T1 is turned off, a gate voltage of the second transistor T2 still can be maintained as the data signal voltage due to an action of the capacitor C, so that the second transistor T2 is in a turned-on state, and a driving current corresponding to the high voltage signal terminal VDD and the data signal voltage enters the organic light emitting diode D through the second transistor T2 to drive the organic light emitting diode D to emit light.

In the above AMOLED display device, the organic light emitting diode D emits light in accordance with the driving current generated by the second transistor T2 in a saturated state. Since a threshold voltage of the second transistor T2 in each pixel is different due to non-uniformity in the process of manufacturing TFT and the threshold voltage Vth of the second transistor T2 may drift in different degrees during light emission of the organic light emitting diode D, when driving is performed by adopting the 2T1C driving circuit described above, luminance uniformity of the respective pixels is poor, which may result in poor effects such as uneven displaying.

SUMMARY

In order to at least solve one of the technical problems existing in the prior art, the present disclosure provides a pixel compensation circuit and an AMOLED display device comprising the pixel compensation circuit, so as to avoid occurrence of luminance changing of the light emitting device during light emission, and thereby improve luminance evenness during light emission.

An embodiment of the present disclosure provides a pixel compensation circuit, the pixel compensation circuit comprises a data signal writing sub-circuit, a high voltage signal writing sub-circuit, a first reference voltage writing sub-circuit, a second reference voltage writing sub-circuit, a voltage maintaining sub-circuit, a driving transistor, a capacitor, and a light emitting device. The data signal writing sub-circuit is connected to a first terminal of the capacitor, the first reference voltage writing sub-circuit is connected to a control electrode of the driving transistor, and the second reference voltage writing sub-circuit is connected to a drain of the driving transistor. The high voltage signal writing sub-circuit is connected to a second terminal of the capacitor, and the voltage maintaining sub-circuit is connected to the first terminal of the capacitor and the control electrode of the driving transistor. A source of the driving transistor is connected to the second terminal of the capacitor, and a drain of the driving transistor is connected to an anode of the light emitting device. A cathode of the light emitting device is connected to a common ground electrode.

Optionally, the pixel compensation circuit further comprises a connection control sub-circuit connected between the drain of the driving transistor and the anode of the light emitting device, and configured to control ON-OFF between the driving transistor and the light emitting device.

Optionally, the data signal writing sub-circuit comprises a data signal line and a first transistor, a control electrode of the first transistor is connected to a gate line, a source of the first transistor is connected to the data signal line, and a drain of the first transistor is connected to the first terminal of the capacitor.

Optionally, the first reference voltage writing sub-circuit comprises a first reference voltage terminal and a second transistor, a control electrode of the second transistor is connected to a gate line, a source of the second transistor is connected to the first reference voltage terminal, and a drain of the second transistor is connected to the control electrode of the driving transistor.

Optionally, the second reference voltage writing sub-circuit comprises a second reference voltage terminal and a third transistor, a control electrode of the third transistor is connected to a gate line, a source of the third transistor is connected to the second reference voltage terminal, and a drain of the third transistor is connected to the drain of the driving transistor and the anode of the light emitting device.

Alternatively, the second reference voltage writing sub-circuit comprises a second reference voltage terminal and a third transistor, a control electrode of the third transistor is connected to a gate line, a source of the third transistor is connected to the second reference voltage terminal, a drain of the third transistor is connected to the drain of the driving transistor and the connection control sub-circuit Optionally, the high voltage signal writing sub-circuit comprises a high voltage signal terminal and a fourth transistor, a control electrode of the fourth transistor is connected to a first light emitting signal terminal, a source of the fourth transistor is connected to the high voltage signal terminal, and a drain of the fourth transistor is connected to the second terminal of the capacitor.

Optionally, the voltage maintaining sub-circuit comprises a fifth transistor, a control electrode of the fifth transistor is connected to a first light emitting signal terminal, a source of the fifth transistor is connected to the first terminal of the capacitor, and a drain of the fifth transistor is connected to the control electrode of the driving transistor.

Optionally, the connection control sub-circuit comprises a sixth transistor, a control electrode of the sixth transistor is connected to a second light emitting signal terminal, a source of the sixth transistor is connected to the drain of the driving transistor and the second reference voltage writing sub-circuit, and a drain of the sixth transistor is connected to the anode of the light emitting device.

An embodiment of the present disclosure further provides an AMOLED display device, comprising any of the pixel compensation circuit described above.

In the pixel compensation circuit according to the embodiment of the present disclosure, in a pre-light emitting stage of the light emitting device, the first reference voltage is written into the gate of the driving transistor through the first reference voltage writing sub-circuit, and the second reference voltage is written into the drain of the driving transistor through the second reference voltage writing sub-circuit, so that the voltage at the source of the driving transistor includes a component of the threshold voltage Vth of the driving transistor, thus, the driving current generated at the light emitting stage of the light emitting device is independent of the threshold voltage of the driving transistor and the voltage at the high voltage terminal, in this way, uniformity of manufacturing technique of the driving transistor, drifting of the threshold voltage with of the driving transistor during light emission, and a voltage drop of the high voltage signal terminal will not affect the light emitting luminance of the light emitting device, luminance changing of the light emitting device during light emission can be avoided, and luminance evenness of the light emitting device during light emission can be improved. Also, at the light emitting stage of the light emitting device, the capacitor is maintained in a suspended state so that a voltage difference between its two terminals (i.e., a voltage difference between the gate and the source of the driving transistor) is kept constant, so that the driving current will not change along with the voltage change of the high voltage signal terminal, accordingly, luminance changing of the light emitting device during light emission can be further avoided, and luminance evenness of the light emitting device during light emission can be further improved.

The AMOLED display device according to the embodiment of the present disclosure employs the pixel compensation circuit according to the embodiment of the present disclosure as described above, it can avoid the light emitting luminance of the light emitting device in each pixel from being changed within one frame of picture, prevent the light emitting luminance of the light emitting device within the respective pixels from becoming uneven due to manufacturing of the driving transistor, and thereby improve display effect and display uniformity.

BRIEF DESCRIPTION OF THE DRAWINGS

The drawings are to provide a further understanding of the present disclosure and constitute a part of the specification, the drawings are intended to explain the present disclosure together with the following detailed embodiments and are not to be construed as limiting the present disclosure. In the drawings.

DETAILED DESCRIPTION OF THE EMBODIMENTS

Hereinafter, the embodiments of the present disclosure will be described in detail with reference to the accompanying drawings. It is to be understood that the specific embodiments described herein are for the purpose of illustration and explanation only, and are not intended to limit the present disclosure.

Figure 1:
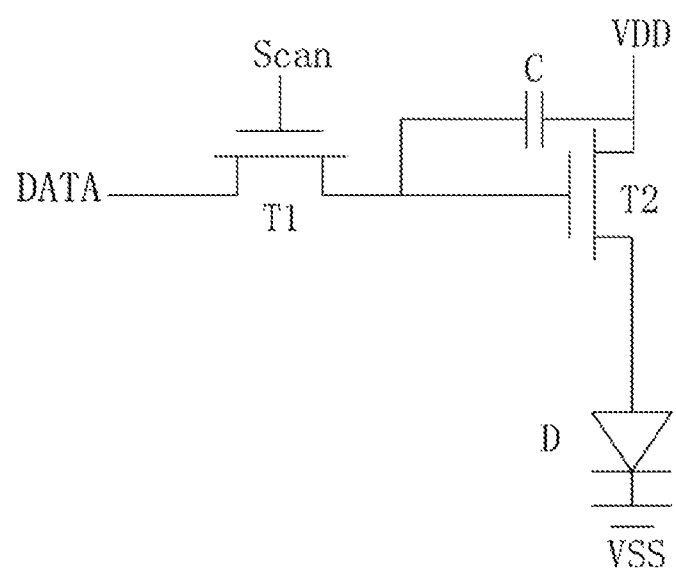
FIG. 1 a circuit diagram of the AMOLED pixel circuit in the prior art.
Figure 2:
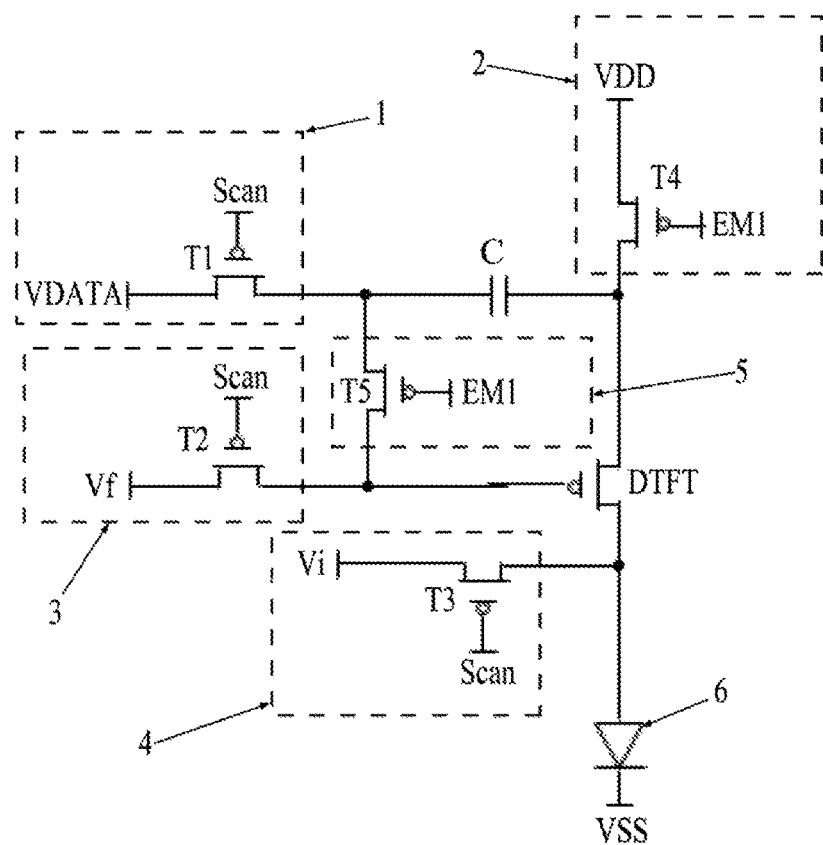
FIG. 2 is a circuit diagram of the pixel compensation circuit according to an embodiment of the present disclosure.

FIG. 2 is a circuit diagram of the pixel compensation circuit according to an embodiment of the present disclosure. As shown in FIG. 2, in this embodiment, the pixel compensation circuit comprises a data signal writing sub-circuit 1, a high voltage signal writing sub-circuit 2, a first reference voltage writing sub-circuit 3, a second reference voltage writing sub-circuit 4, a voltage maintaining sub-circuit 5, a driving transistor DTFT, a capacitor C, and a light emitting device 6. The data signal writing sub-circuit 1 is connected to a first terminal of the capacitor C. The first reference voltage writing sub-circuit 3 is connected to a control electrode of the driving transistor DTFT. The second reference voltage writing sub-circuit 4 is connected to a drain of the driving transistor DTFT. The high voltage signal writing sub-circuit 2 is connected to a second terminal of the capacitor C. The voltage maintaining sub-circuit 5 is connected to the first terminal of the capacitor C and the control electrode of the driving transistor DTFT. A source of the driving transistor DTFT is connected to the second terminal of the capacitor C, a drain of the driving transistor DTFT is connected to an anode of the light emitting device 6. A cathode of the light emitting device 6 is connected to a common ground electrode VSS. The light emitting device 6 may comprise an OLED (Organic Light Emitting Diode).

Specifically, as shown in FIG. 2, the data signal writing sub-circuit 1 comprises a data signal line DATA and a first transistor T1. The data signal line Data outputs a data signal DATA whose voltage value is VDATA. A control electrode (i.e., gate) of the first transistor T1 is connected to a gate line Scan, a source of the first transistor T1 is connected to the data signal line DATA, and a drain of the first transistor T1 is connected to the first terminal of the capacitor C.

The first reference voltage writing sub-circuit 3 comprises a first reference voltage terminal Vf and a second transistor T2. The first reference voltage terminal Vf outputs a first reference voltage Vf. A control electrode (i.e., gate) of the second transistor T2 is connected to the gate line Scan, a source of the second transistor T2 is connected to the first reference voltage terminal Vf, and a drain of the second transistor T2 is connected to the control electrode (i.e., gate) of the driving transistor DTFT.

The second reference voltage writing sub-circuit 4 comprises a second reference voltage terminal Vi and a third transistor T3. The second reference voltage terminal Vi outputs a second reference voltage Vi. A control electrode (i.e., gate) of the third transistor T3 is connected to the gate line Scan, a source of the third transistor T3 is connected to the second reference voltage terminal Vi, a drain of the third transistor T3 is connected to the drain of the driving transistor DTFT and the anode of the light emitting device 6.

The high voltage signal writing sub-circuit 2 comprises a high voltage signal terminal VDD and a fourth transistor T4. The high voltage signal terminal outputs a high voltage signal VDD. A control electrode (i.e., gate) of the fourth transistor T4 is connected to a first light emitting signal terminal EM1, a source of the fourth transistor T4 is connected to the high voltage signal terminal VDD, and a drain of the fourth transistor T4 is connected to the second terminal of the capacitor C.

In addition, the voltage maintaining sub-circuit 5 comprises a fifth transistor T5. A control electrode (i.e., gate) of the fifth transistor T5 is connected to the first light emitting signal terminal EM1, a source of the fifth transistor T5 is connected to the first terminal of the capacitor C, and a drain of the fifth transistor T5 is connected to the control electrode (i.e., gate) of the driving transistor DTFT.

Figure 3:
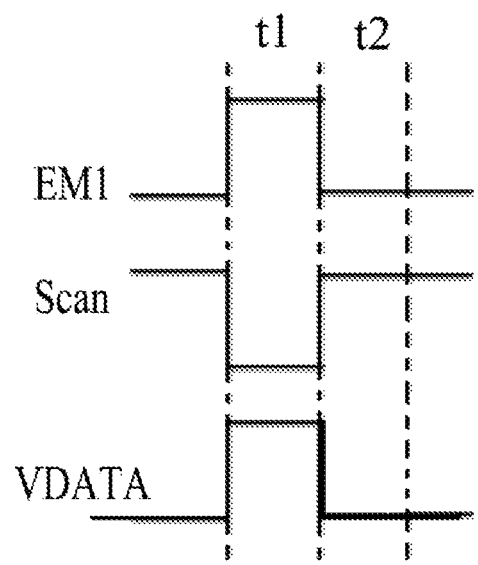
FIG. 3 is a timing diagram of the respective signals in the pixel compensation circuit shown in FIG. 2.

In this embodiment, the first transistor T1, the second transistor T2, the third transistor T3, the fourth transistor T4, the fifth transistor T5, and the driving transistor DTFT are P-type transistors. In this case, timing of the respective signals is as shown in FIG. 3. The light emitting process of the light emitting device 6 driven by the pixel compensation circuit shown in FIG. 2 will be described in detail with reference to the timing shown in FIG. 3.

The first stage t1 is a non-light emitting stage (i.e., a pre-light emitting stage) of the light emitting device 6. Specifically, at this stage, a scanning signal outputted by the gate line Scan is at a low voltage level, a light emitting signal outputted by the first light emitting signal terminal EM1 is at a high voltage level, and a data signal outputted by the data signal line DATA is at a high voltage level. In this case, the first transistor T1, the second transistor T2, and the third transistor T3 are turned on, the fourth transistor T4 and the fifth transistor T5 are turned off, and the equivalent circuit diagram at this moment is shown in FIG. 4.

Figure 4:
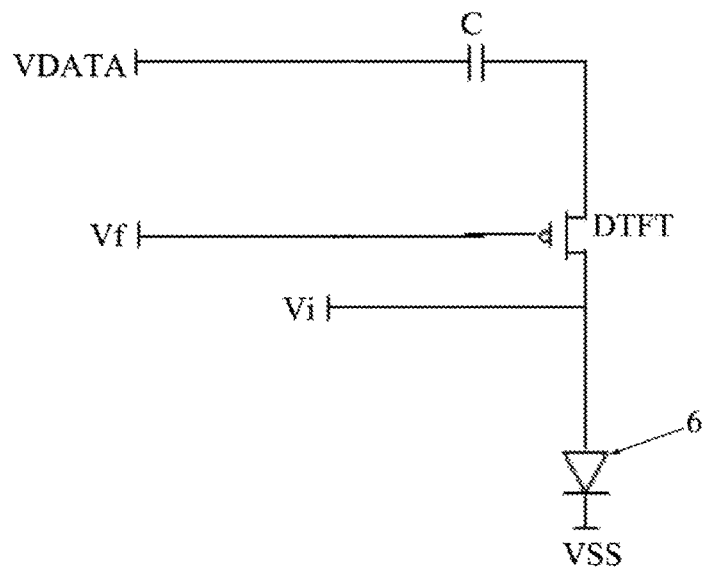
FIG. 4 is an equivalent circuit diagram at a stage t1.

Referring to FIG. 4, the data signal line DATA is connected to the first terminal of the capacitor C, and inputs the data signal DATA to the first terminal of the capacitor C, so that a voltage at the first terminal of the capacitor C is VDATA. Meanwhile, the first reference voltage terminal Vf is connected to the gate of the driving transistor DTFT, so that a gate voltage of the driving transistor DTFT is equal to the first reference voltage Vf. Meanwhile, the second reference voltage terminal Vi is connected to the drain of the driving transistor DTFT, so that a drain voltage of the driving transistor DTFT is equal to the second reference voltage Vi.

At the beginning of the stage t1, the drain of the driving transistor DTFT maintains a voltage corresponding to the moment when the previous frame of picture ends, and its voltage is specifically VDD. In the duration of the first stage t1, since the driving transistor DTFT is disconnected from the high voltage signal terminal VDD at the stage t1, thus, in the case where the gate of the driving transistor DTFT is connected to the first reference voltage terminal Vf and the drain of the driving transistor DTFT is connected to the second reference voltage Vf, a source voltage of the driving transistor DTFT (i.e., the voltage at the second terminal of the capacitor C) will change, and this source voltage finally satisfies the following Formula (1):

$$Vs = Vf - Vth \tag{1}$$

where Vs is a voltage at the source of the driving transistor and Vth is a threshold voltage of the driving transistor DTFT.

According to this formula, the voltage at the source of the driving transistor DTFT includes a component of the threshold voltage Vth of the driving transistor DTFT, thereby achieves grasping of the threshold voltage Vth. In addition, in this embodiment, the threshold voltage Vth corresponding to a different Vds (i.e., a voltage difference between the source and the drain of the driving transistor DTFT) may be grasped by setting the value of the second reference voltage Vi.

In addition, at the stage t1, the second reference voltage terminal Vi may be connected to the anode of the light emitting device 6, so as to write the second reference voltage Vi to the anode of the light emitting device 6, so that the voltage of the previous frame of picture as maintained at the anode of the light emitting device 6 can be removed at the stage t1, in this way, accuracy of the light emitting luminance of the light emitting device 6 in the light emitting phase of this frame of picture can be ensured without deviation.

The second stage t2 is a light emitting stage of the light emitting device 6. Specifically, at this stage, the scanning signal outputted by the gate line Scan is at a high voltage level, the light emitting signal outputted by the first light emitting signal terminal EM1 is at a low voltage level, and the data signal DATA outputted by the data signal line DATA is at a low voltage level. In this case, the first transistor T1, the second transistor T2, and the third transistor T3 are turned off, the fourth transistor T4 and the fifth transistor T5 are turned on, and an equivalent circuit diagram at this moment is shown in FIG. 5.

Figure 5:
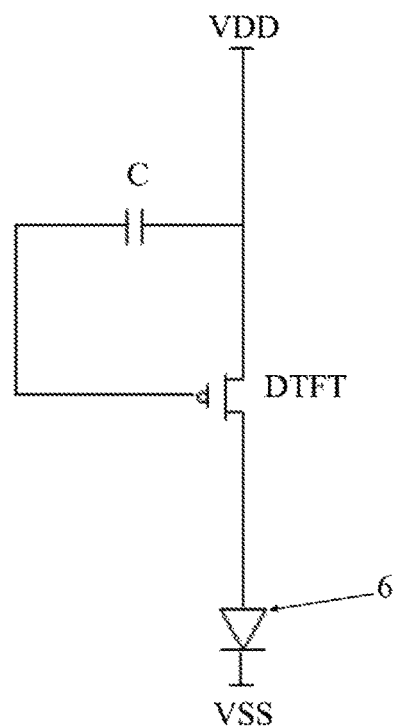
FIG. 5 is an equivalent circuit diagram at a stage t2.

Referring to FIG. 5, the gate of the driving transistor DTFT is connected to the first terminal of the capacitor C, and the source of the driving transistor DTFT is connected to the second terminal of the capacitor C. Therefore, a voltage difference Vgs between the gate and the source of the driving transistor DTFT is equal to a voltage difference Δs between two terminals of the capacitor C. In addition, the high voltage signal terminal VDD is connected to the second terminal of the capacitor C and the source of the driving transistor DTFT, so that the voltage at the second terminal of the capacitor C and at the source of the driving transistor DTFT becomes VDD. On the other hand, since the first terminal of the capacitor C is in a floating state, thus a voltage change at the second terminal of the capacitor C does not cause a change in the voltage difference between two terminals of the capacitor C, and the voltage difference Δs between two terminals of the capacitor C maintains the value at the stage t1. Finally, the voltage difference Vgs between the gate and the source of the driving transistor DTFT satisfies the following Formula (2):

$$Vgs=Vg-Vs=VDATA-Vf+Vth \quad (2)$$

Therefore, it can be derived that a current for driving the light emitting device 6 as generated in accordance with the driving transistor DTFT at the stage t2

$$I_{OLED} = k(Vgs - Vth)^2 \quad (3)$$
$$= k(VDATA - Vf + Vth - Vth)^2$$
$$= k(VDATA - Vf)^2$$

According to the above Formula (3), the current $I_{OLED}$ for driving the light emitting device 6 to emit light is independent of either the threshold voltage Vth of the driving transistor DTFT or the VDD. Therefore, uniformity of manufacturing of the driving transistor DTFT, drifting of the threshold voltage Vth of the driving transistor DTFT during light emission, and a voltage drop (IR Drop) of VDD do not affect the light emitting luminance of the light emitting device 6, so that the luminance change of the light emitting device 6 during light emission can be avoided, and the luminance uniformity of the light emitting device 6 during light emission can be improved.

On the other hand, at the stage t2, since the capacitor C is in a floating state, when a voltage at the high voltage signal terminal VDD changes, the voltage difference Δs between two terminals of the capacitor C is constant, i.e., the voltage difference Vgs between the gate and the source of the driving transistor DTFT is maintained constant, so that the generated driving current $I_{OLED}$ does not fluctuate due to the voltage change of VDD, thereby it is possible to farther ensure that the driving current $I_{OLED}$ stays stable, and the luminance change of the light emitting device 6 during light emission can be avoided, and the luminance uniformity of the light emitting device 6 during light emission can be improved.

In addition, in this embodiment, by means of setting the value of the second reference voltage Vi, it is possible to grasp the threshold voltage Vth corresponding to a different Vds value, so that the effect of the threshold voltage Vth at a different Vds can be pertinently eliminated, accordingly, better compensation effect can be obtained, the current generated at the stage t2 to drive the light emitting device 6 is more stable, and luminance uniformity of light emitting of the light emitting device 6 is ensured.

Figure 6:
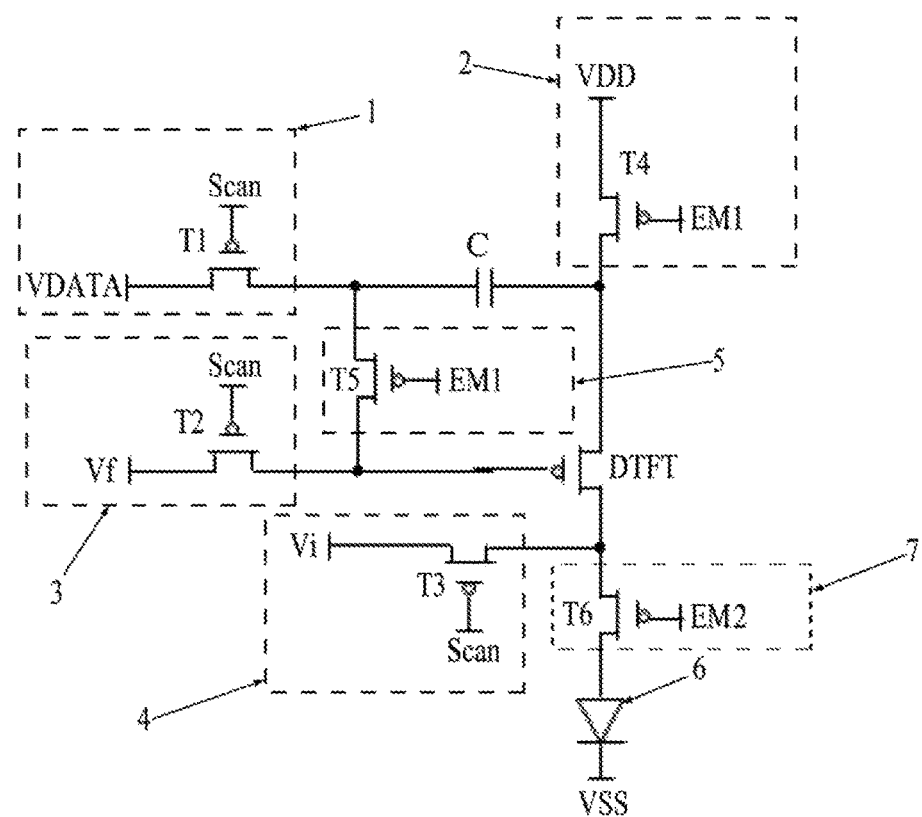
FIG. 6 is a circuit diagram of the pixel compensation circuit according to an embodiment of the present disclosure.

FIG. 6 is a circuit diagram of the pixel compensation circuit according to an embodiment of the present disclosure. As shown in FIG. 6, different than the above embodiment, the pixel compensation circuit in this embodiment further comprises a connection control sub-circuit 7, the connection control sub-circuit 7 is connected between the drain of the driving transistor DTFT and the anode of the light emitting device 6, and is configured to control ON-OFF between the driving transistor DTFT and the light emitting device 6.

Specifically, in this embodiment, the second reference voltage writing sub-circuit 4 comprises a second reference voltage terminal Vi and a third transistor T3, a control electrode (i.e., gate) of the third transistor T3 is connected to the gate line Scan, a source of the third transistor T3 is connected to the second reference voltage terminal Vi, and a drain of the third transistor T3 is connected to the drain of the driving transistor DTFT and the connection control sub-circuit 7. In addition, the connection control sub-circuit 7 comprises a sixth transistor T6, a control electrode (i.e., gate) of the sixth transistor T6 is connected to the second light emitting signal terminal FM2, a source of the sixth transistor T6 is connected to the drain of the driving transistor DTFT and the second reference voltage writing sub-circuit 4, and a drain of the sixth transistor T6 is connected to the anode of the light emitting device 6.

Figure 7:
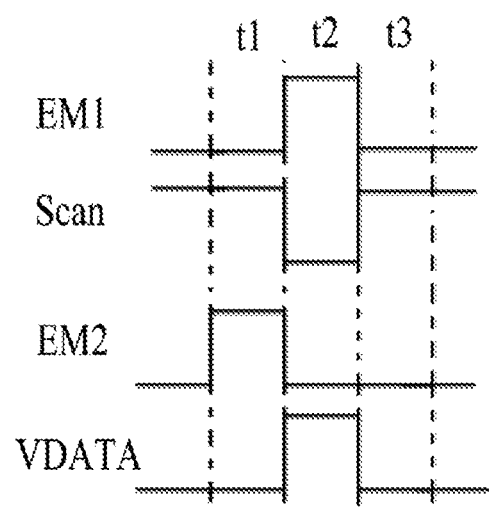
FIG. 7 is a timing diagram of the respective signals in the pixel compensation circuit shown in FIG. 6.

FIG. 7 is a timing diagram of the respective signals in the pixel compensation circuit shown in FIG. 6. As shown in FIG. 7, in this embodiment, the pre-light emitting stage of the light emitting device 6 is divided into two stages t1 and t2, and the light emitting stage of the light emitting device 6 is the third stage, that is, the stage t3.

Specifically, in the stage t1, a light emitting signal outputted by the first light emitting signal terminal EM1 is at low voltage level, a scanning signal outputted by the gate line Scan is at a high voltage level, and a light emitting signal outputted by the second light emitting signal terminal EM2 is at a high voltage level, and a data signal DATA outputted by the data signal line DATA is at a low voltage level. In this case, the first transistor T1, the second transistor T2, and the third transistor T3 are turned off, the fourth transistor T4 and the filth transistor T5 are turned on, and the sixth transistor T6 is turned off. In addition, the high voltage signal terminal VDD is connected to the second terminal of the capacitor C and the source of the driving transistor DTFT, so that the voltage at the second terminal of the capacitor C or at the source of the driving transistor DTFT is VDD. The stage t2 is the same as the stage t1 in the above embodiment, and the stage t3 is the same as the stage t2 in the above embodiment, no more details are repeated here.

In this embodiment, one stage is added before the stage t1 in the above embodiment, and the voltage VDD is written to the second terminal of the capacitor C and the source of the driving transistor DTFT at this added stage, the VDD can ensure that the voltage at the second terminal of the capacitor C and an initial voltage at the source of the driving transistor DTFT to be VDD in this frame of picture in the case where the previous frame of picture ends and the voltage at the second terminal of the capacitor C or at the source of the driving transistor DTFT is abnormal.

To sum up, in the pixel compensation circuit according to the embodiment of the present disclosure, in a pre-light emitting stage of the light emitting device 6, the first reference voltage Vf is written into the gate of the driving transistor DTFT through the first reference voltage writing sub-circuit 3, and the second reference voltage Vi is written into the drain of the driving transistor DTFT through the second reference voltage writing sub-circuit 4, so that the voltage at the source of the driving transistor DTFT includes a component of the threshold voltage Vth of the driving transistor DTFT, thus, the driving current generated at the light emitting stage of the light emitting device 6 is independent of the threshold voltage of the driving transistor DTFT and the voltage at the high voltage terminal VDD, in this way, uniformity of manufacturing technique of the driving transistor DTFT, drifting of the threshold voltage with of the driving transistor DTFT during light emission, and a voltage drop of the high voltage signal terminal will not affect the light emitting luminance of the light emitting device 6, luminance changing of the light emitting device 6 during light emission can be avoided, and luminance evenness of the light emitting device 6 during light emission can be improved. Also, at the light emitting stage of the light emitting device 6, the capacitor C is maintained in a suspended state so that a voltage difference between its two terminals (i.e., a voltage difference between the gate and the source of the driving transistor DTFT) is kept constant, so that the driving current will not change along with the voltage change of the high voltage signal terminal VDD, accordingly, luminance changing of the light emitting device 6 during light emission can be further avoided, and luminance evenness of the light emitting device 6 during light emission can be further improved.

In another aspect, an embodiment of the present disclosure further provides an AMOLED display device. In this embodiment, the AMOLED display device comprises the pixel compensation circuit provided in the above embodiment.

The AMOLED display device according to the embodiment of the present disclosure employs the pixel compensation circuit according to the embodiment of the present disclosure as described above, it can avoid the light emitting luminance of the light emitting device in each pixel from being changed within one frame of picture, prevent the light emitting luminance of the light emitting device within the respective pixels from becoming uneven due to manufacturing of the driving transistor, and thereby improve display effect and display uniformity.

As will be appreciated, the above described are merely some exemplary embodiments of the present disclosure adopted to illustrate the principles of the present disclosure, however, the present disclosure is not limited thereto, those of ordinary skill in the art can make various variants and improvements without departing from the spirits and substances of the present disclosure, and these variants and improvements also fall into the protection scope of the present disclosure.

What is claimed is:

1. A pixel compensation circuit, comprising a data signal writing sub-circuit, a high voltage signal writing sub-circuit, a first reference voltage writing sub-circuit, a second reference voltage writing sub-circuit, a voltage maintaining sub-circuit, a driving transistor, a capacitor, and a light emitting device, wherein
   the data signal writing sub-circuit is connected to a first terminal of the capacitor, the first reference voltage writing sub-circuit is connected to a control electrode of the driving transistor, and the second reference voltage writing sub-circuit is connected to a drain of the driving transistor;
   the high voltage signal writing sub-circuit is connected to a second terminal of the capacitor, and the voltage maintaining sub-circuit is connected to the first terminal of the capacitor and the control electrode of the driving transistor;
   a source of the driving transistor is connected to the second terminal of the capacitor, and a drain of the driving transistor is connected to an anode of the light emitting device; and
   a cathode of the light emitting device is connected to a common ground electrode.

2. The pixel compensation circuit according to claim 1, further comprising a connection control sub-circuit connected between the drain of the driving transistor and the anode of the light emitting device, and configured to control ON-OFF between the driving transistor and the light emitting device.

3. The pixel compensation circuit according to claim 2, wherein the second reference voltage writing sub-circuit comprises a second reference voltage terminal and a third transistor,
   a control electrode of the third transistor is connected to a gate line, a source of the third transistor is connected to the second reference voltage terminal, a drain of the third transistor is connected to the drain of the driving transistor and the connection control sub-circuit.

4. The pixel compensation circuit according to claim 2, wherein the connection control sub-circuit comprises a sixth transistor,
   a control electrode of the sixth transistor is connected to a second light emitting signal terminal, a source of the sixth transistor is connected to the drain of the driving transistor and the second reference voltage writing sub-circuit, and a drain of the sixth transistor is connected to the anode of the light emitting device.

5. The pixel compensation circuit according to claim 1, wherein the data signal writing sub-circuit comprises a data signal line and a first transistor,
   a control electrode of the first transistor is connected to a gate line, a source of the first transistor is connected to the data signal line, and a drain of the first transistor is connected to the first terminal of the capacitor.

6. The pixel compensation circuit according to claim 1, wherein the first reference voltage writing sub-circuit comprises a first reference voltage terminal and a second transistor,
   a control electrode of the second transistor is connected to a gate line, a source of the second transistor is connected to the first reference voltage terminal, and a drain of the second transistor is connected to the control electrode of the driving transistor.

7. The pixel compensation circuit according to claim 1, wherein the second reference voltage writing sub-circuit comprises a second reference voltage terminal and a third transistor,
   a control electrode of the third transistor is connected to a gate line, a source of the third transistor is connected to the second reference voltage terminal, and a drain of the third transistor is connected to the drain of the driving transistor and the anode of the light emitting device.

8. The pixel compensation circuit according to claim 1, wherein the high voltage signal writing sub-circuit comprises a high voltage signal terminal and a fourth transistor,
   a control electrode of the fourth transistor is connected to a first light emitting signal terminal, a source of the fourth transistor is connected to the high voltage signal terminal, and a drain of the fourth transistor is connected to the second terminal of the capacitor.

9. The pixel compensation circuit according to claim 1, wherein the voltage maintaining sub-circuit comprises a fifth transistor,
   a control electrode of the fifth transistor is connected to a first light emitting signal terminal, a source of the fifth transistor is connected to the first terminal of the capacitor, and a drain of the fifth transistor is connected to the control electrode of the driving transistor.

10. An AMOLED display device, comprising:
    a pixel compensation circuit the pixel compensation circuit comprising a data signal writing sub-circuit, a high voltage signal writing sub-circuit a first reference voltage writing sub-circuit, a second reference voltage writing sub-circuit, a voltage maintaining sub-circuit a driving transistor, a capacitor, and a light emitting device, wherein
    the data signal writing sub-circuit is connected to a first terminal of the capacitor, the first reference voltage writing sub-circuit is connected to a control electrode of the driving transistor, and the second reference voltage writing sub-circuit is connected to a drain of the driving transistor;

the high voltage signal writing sub-circuit is connected to a second terminal of the capacitor, and the voltage maintaining sub-circuit is connected to the first terminal of the capacitor and the control electrode of the driving transistor;

a source of the driving transistor is connected to the second terminal of the capacitor, and a drain of the driving transistor is connected to an anode of the light emitting device; and a cathode of the light emitting device is connected to a common around electrode.

11. The AMOLED display device according to claim 10, wherein the pixel compensation circuit further comprises a connection control sub-circuit connected between the drain of the driving transistor and the anode of the light emitting device, and is configured to control ON-OFF between the driving transistor and the light emitting device.

12. The AMOLED display device according to claim 11, wherein the second reference voltage writing sub-circuit comprises a second reference voltage terminal and a third transistor, a control electrode of the third transistor is connected to a gate line, a source of the third transistor is connected to the second reference voltage terminal, a drain of the third transistor is connected to the drain of the driving transistor and the connection control sub-circuit.

13. The AMOLED display device according to claim 11, wherein the connection control sub-circuit comprises a sixth transistor, a control electrode of the sixth transistor is connected to a second light emitting signal terminal, a source of the sixth transistor is connected to the drain of the driving transistor and the second reference voltage writing sub-circuit, and a drain of the sixth transistor is connected to the anode of the light emitting device.

14. The AMOLED display device according to claim 10, wherein the data signal writing sub-circuit comprises a data signal line and a first transistor, a control electrode of the first transistor is connected to a gate line, a source of the first transistor is connected to the data signal line, and a drain of the first transistor is connected to the first terminal of the capacitor.

15. The AMOLED display device according to claim 10, wherein the first reference voltage writing sub-circuit comprises a first reference voltage terminal and a second transistor, a control electrode of the second transistor is connected to a gate line, a source of the second transistor is connected to the first reference voltage terminal, and a drain of the second transistor is connected to the control electrode of the driving transistor.

16. The AMOLED display device according to claim 10, wherein the second reference voltage writing sub-circuit comprises a second reference voltage terminal and a third transistor, a control electrode of the third transistor is connected to a gate line, a source of the third transistor is connected to the second reference voltage terminal, and a drain of the third transistor is connected to the drain of the driving transistor and the anode of the light emitting device.

17. The AMOLED display device according to claim 10, wherein the high voltage signal writing sub-circuit comprises a high voltage signal terminal and a fourth transistor, a control electrode of the fourth transistor is connected to a first light emitting signal terminal, a source of the fourth transistor is connected to the high voltage signal terminal, and a drain of the fourth transistor is connected to the second terminal of the capacitor.

18. The AMOLED display device according to claim 10, wherein the voltage maintaining sub-circuit comprises a fifth transistor, a control electrode of the fifth transistor is connected to a first light emitting signal terminal, a source of the fifth transistor is connected to the first terminal of the capacitor, and a drain of the fifth transistor is connected to the control electrode of the driving transistor.

* * * * *